April 29, 1969 R. C. TROMBLEY 3,441,657

SEMICONDUCTOR LEAD ASSEMBLIES

Filed Dec. 21, 1966

INVENTOR.
Robert C. Trombley
BY
Mueller, Aichele & Rauner
ATTY'S.

1

3,441,657
SEMICONDUCTOR LEAD ASSEMBLIES

Robert C. Trombley, Phoenix, Ariz., assignor to Motorola, Inc., Franklin Park, Ill., a corporation of Illinois
Filed Dec. 21, 1966, Ser. No. 603,604
Int. Cl. H05k 5/00
U.S. Cl. 174—52 10 Claims

ABSTRACT OF THE DISCLOSURE

Semiconductor device leads are formed in a cup shaped member with the base of the cups facing each other for holding a semiconductor unit or die therebetween. The cups extend coaxially with the leads. Plastic material encapsulates the entire assembly and is forced into the space between the cups and the leads for forming a moisture retardation assembly. The material forming the cup acts as a momentary heat sink for protecting the semiconductor unit from burn-out during a current surge.

*Background of the invention*

This invention relates to semiconductor assemblies and more particularly to an improved lead end assembly for protecting and supporting a semiconductor die.

Semiconductor devices are being encapsulated in plastic because of lower cost. When plastic encapsulation is used the bond between the leads of the semiconductor device and the plastic encapsulated material often permits moisture to enter into the device, such that when it reaches the die the device is ruined. Such plastic encapsulation is usually made by a molding operation under extreme pressures with resultant stresses being formed at any corner or bend and next to the semcionductor device leads. Such stresses do form a moisture retarding joint, however the retardation is insufficient to prevent moisture encroachment into a semiconductor device.

In order to obviate the moisture encroachment problem, lead ends have been flattened in the manner of a nail head. The semiconductor die is then affixed to opposed faces of the nail heads. The theory is that the increased moisture path length caused by the radially outwardly extending nail heads or radial flanges will prevent the moisture from reaching the semiconductor die under normal operating conditions. It has been found that such nail heads do not always prevent moisture from encroaching upon and ruining the semiconductor die. Further, a plurality of axially spaced apart nail heads (double nail heads) have been formed in an attempt to improve the moisture retardation of the device. Such devices require at least a two-step forming process to make such axially spaced apart radially extending flanges and yet do not provide an effective moisture barrier.

Further semiconductor devices are subject to damage caused by momentary current surges causing a large momentary increase in temperature of the semiconductor die. It is desirable for reliability purposes to provide a heat sink adjacent the semiconductor die for absorbing any increase in energy to prevent raising the temperature of the die to a damaging level.

*Summary of the invention*

It is an object of this invention to provide a low cost moisture-retarding heat-sink lead end portion for an electrical device.

It is another object of this invention to provide a combined moisture retardation structure and heat sink for a lead end portion of an electrical device which is easy to fabricate in a one-step forming operation.

2

A structure embodying the present invention features a plastic encapsulated electrical device with opposed lead end portions formed preferably on a single axis. Each lead portion has a cup shaped structure having a radially extending flat surface lead axially end for attachment to a semiconductor die or other electrical unit and with a tubular axially-extending portion circumferentially affixed thereto and spaced from the lead end portion. A pair of such structures with their axial ends being in opposed relationship will support a semiconductor die or other electrical unit intermediate the radially extending surfaces. The cup shaped structure may be notched to receive the plastic encapsulated material for preventing relative twisting of the two lead end portions for preventing torsional stresses from being in the semiconductor induced in the supported electrical unit, especially when the unit is a semiconductor.

*Description of the preferred embodiment*

Figure 1:
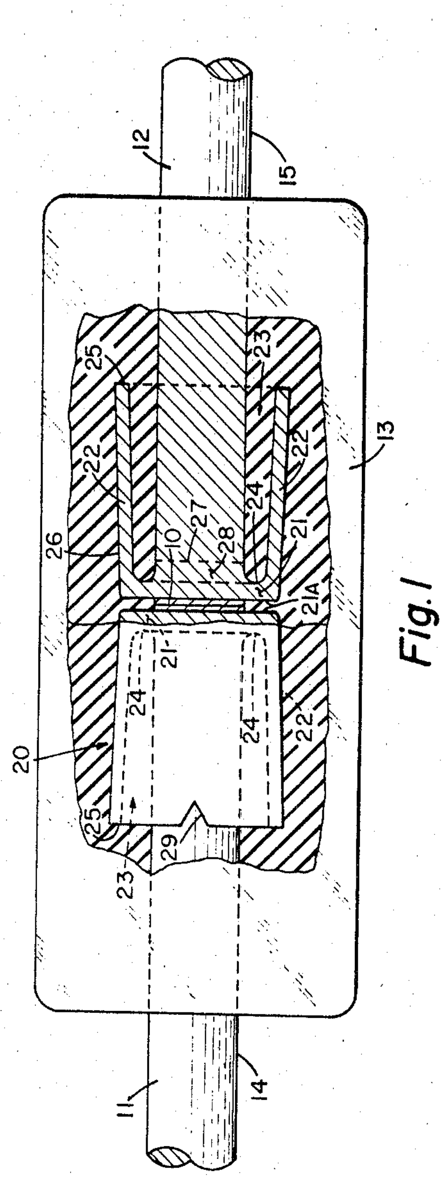
FIG. 1 is a greatly enlarged plan view with partial cross-sectional view to show internal construction of a device embodying the teaching of the present invention.

In FIG. 1 there is shown an electrical unit 10, which may be a semiconductor rectifier die of the usual construction, mounted between a pair of opposed lead end portions 11 and 12 which also serve as electrical connections to electrical unit 10. Plastic housing material 13 is molded over the structure for encapsulating same and keeping moisture from unit 10. Encapsulating material 13 tightly abuts leads 11 and 12 respectively along the surfaces 14 and 15. During the molding operation stresses are set up in the plastic material which tend to make an extremely tight fit against the respective leads. Such a tight fit tends to retard moisture movement therealong toward unit 10. It has been found however that moisture will move in the space between the leads 11, 12 and the housing 13. To retard such moisture movements cup-shaped structures 20 are provided on the respective facing or opposed axial ends of leads 11 and 12 as shown. Each cup 20 has opposed facing connector portions 21 forming the bottom of the respective cups. The unit 10 is attached to the flat surfaces 21A of portion 21 in any known manner. At the radial outward circumference of portion 21 there is integrally formed axially extending tubular portion 22 forming an annular space 23 between an inner-surface of the tubular portion 22 and the outer surfaces of the leads 11 and 12, respectively. Annular spaces 23 terminate at the end of the leads 11 and 12, as at 24. Annular spaces 23 may typically be 10 to 20 mils as measured radially of cup structure 20 at ends 25. A plastic material 13 completely fills annular space 23 and bears tightly against the abutting surfaces of portions 22, 11 and 12. When the housing 13 is formed the plastic material freely flows into the spaces 23 and when hardened under pressure, for example up to 4,000 p.s.i. ram pressure, stresses are believed to be induced into the encapsulated material causing tight fits along surfaces 14 and 15 of leads 11 and 12 and especially at the end of annular spaces 23, as at 24. The surfaces of portions 22 may be formed at an angle to the axis of leads 11 and 12. Such a taper facilitates the cold forming operation as later referred to for making cup 20. As described, the path that the moisture must now follow between material 13 and cup 20 is along surface 14 around sharp bend 24 and outwardly along the inner surface of tubular portion 22 and thence around the end 25 thereof, thence along surface 26 toward unit 10. This extended long path together with the sharp corners has provided effective moisture retardation. It should be noted that the length of the path is tripled without greatly increasing the radial dimensions of the lead end portion assemblies.

Alternatively, cup shaped portion 20 need not be formed integrally with the leads 11 and 12. For example, lead 11 may terminate as indicated by dotted line 27. A solder layer 28 may be added to lead 27 and then cup assembly 20 placed upon solder layer 28 and attached to the lead through a fusion process. It is preferred however that the cup shaped assembly 20 be integrally formed with the lead end portion.

In cold forming the integral cup shaped portion, a lead, for example lead 11, is placed into a die with the end flattened to a large nail head shape; then in the same motion the flattened portion is folded back to form tubular portions 22 and sharp bends 24. In the same molding operation notch 29 may be formed as shown. Notch 29 cooperates with plastic encapsulation material 13 to prevent lead 12 from turning with respect thereto and thereby prevent torsional stresses from being induced in electrical unit 10. Forming lead end portions 11 and 12 with cups 20 in one operation has reduced the cost of such lead connections by 50 percent over the "double nail head" referred to as being prior art.

The material folded over forming portion 22 has good thermal connection to electrical unit 10 through the end or connector portions 21. Since portions 22 are made of the same material as leads 11 and 12, such as copper, it has good thermal conductivity. Upon the passage of a large current surge, for example 100 times the current rating capacity of unit 10, cup shaped assembly 20 rapidly but momentarily absorbs heat energy from unit 10 keeping it below a temperature at which semiconductor characteristics, for example, may be detrimentally altered. After the surge, the thermal energy in cup shaped assemblies 20 is dissipated through the encapsulating material 13.

The plastic encapsulating housing material 13 may be any insulating material such as an epoxy type of encapsulation including silicones.

Figure 2:
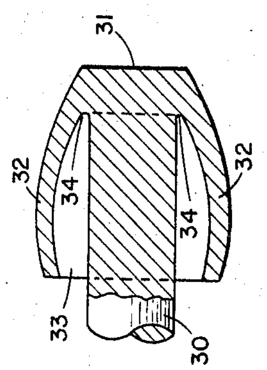
FIG. 2 is a cross-sectional view of a second cup-shaped structure usable with the FIG. 1 illustrated embodiment.

A second cup shape is shown in FIG. 2 on a lead end portion 30. Flat surface 31 forms an electrical engagement as surface 21A of FIG. 1 engages unit 10. Tubular portion 32 is integrally formed on portion 31 and extends axially of lead portion 30 but a short distance in a spaced apart relation to lead end portion 30 forming annular recess 33 which ends at 34.

I claim:

1. For an electrical device having an electrical component and plural separate plate-like electrical connection means, the improvement comprising a connection assembly for electrical connection to one of said electrical connection means, an electrical elongated lead having an end portion with an axial end, connector portion on said axial end and having a flat radially extending surface with an outer circumferential edge and engaging one of said electrical connection means for making electrical connection thereto, a tubular portion circumferentially attached to said connector portion adjacent said circumferential edge and axially extending in spaced apart relation along the length of said lead end portion, said portions being constructed of an electrically and thermally conductive material, and a plastic encapsulation material enclosing said portions and said component and extending between said tubular portion and said lead end portion and being in moisture sealing engagement with said portion.

2. The invention of claim 1 wherein all of said portions are a unitary member.

3. The invention of claim 1 wherein said tubular portion has an axially extending notch for preventing relative motion between said material and said portions.

4. The invention of claim 1 wherein said tubular and connector portions are a unitary cup-shaped member and said connector portion is fused to said axial end.

5. The invention of claim 1 further including, a second lead end portion having a second axial end facing the first mentioned axial end, a second connector portion on said second axial end and having a second flat radially extending surface attached to said component and facing the first mentioned flat surface, a second tubular portion circumferentially connected to said second connector portion and axially extending along said second lead portion in spaced apart relation, and said plastic encapsulating material tightly enclosing the entire assembly and filling both spaces between said tubular portions and the respective lead end portions.

6. The invention of claim 5 wherein said connector portions and said tubular portions are respectively integrally formed with said lead end portions.

7. The invention of claim 5 wherein both of said tubular portions have an axially extending notch at one extremity thereof.

8. The invention of claim 5 wherein said tubular portions are respectively integrally formed with said connector portions as unitary cup-shaped members and said unitary members being respectively fused to said respective leads axial ends.

9. The invention of claim 8 wherein said tubular portions are spaced radially outwardly from said respective lead end portions from about 10 to 20 mils at the respective extremities remote from said axial ends.

10. The invention of claim 8 wherein outer circumferential surfaces of said tubular portions are tapered along the respective lead axes forming a minimum diameter at the respective axial ends.

References Cited

UNITED STATES PATENTS

| | | | |
|---|---|---|---|
| 2,945,914 | 7/1960 | Aamodt | 174—151 |
| 3,070,647 | 12/1962 | Solow et al. | 174—52.6 |
| 3,242,393 | 3/1966 | Paul | 174—52.6 XR |

DARRELL L. CLAY, *Primary Examiner.*

U.S. Cl. X.R.

29—630; 264—272; 317—100, 234